(12) United States Patent
Huang

(10) Patent No.: US 10,276,956 B2
(45) Date of Patent: Apr. 30, 2019

(54) MINIATURIZED ELECTRICAL CONNECTOR FOR CONNECTING A CPU

(71) Applicant: LOTES CO., LTD, Keelung (TW)

(72) Inventor: Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 15/626,360

(22) Filed: Jun. 19, 2017

(65) Prior Publication Data

US 2018/0123270 A1 May 3, 2018

(30) Foreign Application Priority Data

Oct. 28, 2016 (CN) .................... 2016 2 1180593 U

(51) Int. Cl.
| | |
|---|---|
| *H01R 12/71* | (2011.01) |
| *H01R 12/70* | (2011.01) |
| *H01R 12/52* | (2011.01) |
| *H01R 13/24* | (2006.01) |
| *H01R 13/428* | (2006.01) |
| *H01R 13/6585* | (2011.01) |
| *H01R 13/6587* | (2011.01) |
| *H01R 12/00* | (2006.01) |
| *H01R 13/193* | (2006.01) |
| *H01R 12/50* | (2011.01) |
| *H05K 7/10* | (2006.01) |

(52) U.S. Cl.
CPC ......... *H01R 12/7076* (2013.01); *H01R 12/52* (2013.01); *H01R 12/707* (2013.01); *H01R 12/714* (2013.01); *H01R 13/2442* (2013.01); *H01R 13/428* (2013.01); *H01R 13/6585* (2013.01); *H01R 13/6587* (2013.01); *H01R 9/096* (2013.01); *H01R 13/193* (2013.01); *H01R 23/72* (2013.01); *H05K 7/103* (2013.01)

(58) Field of Classification Search
CPC ...... H01R 12/714; H01R 23/72; H01R 9/096; H01R 12/52; H01R 13/193; H01R 13/2442; H05K 7/103
USPC .............................. 439/68, 66, 70, 264, 525
See application file for complete search history.

(56) References Cited

U.S. PATENT DOCUMENTS 9,178,322 B2 * 11/2015 Chang ................ H01R 13/6594
2015/0359122 A1 * 12/2015 Masuda ............... H05K 1/0216
439/68

* cited by examiner

*Primary Examiner* — Abdullah A Riyami
*Assistant Examiner* — Justin M Kratt
(74) *Attorney, Agent, or Firm* — Locke Lord LLP; Tim Tingkang Xia, Esq.

(57) ABSTRACT

An electrical connector for electrically connecting a chip module includes an insulating body, a signal terminal received in the insulating body, and a first and a second shielding sheets retained in the insulating body. The insulating body sustains a chip module, and the signal terminal elastically urges against the chip module. The first shielding sheet is located on one side of the signal terminal and elastically urges the chip module. The second shielding sheet is located on the other side of the signal terminal, and adjacent to the first shielding sheet. The first and second shielding sheets are communicated through an electric conductor. The second shielding sheet does not urge the chip module.

20 Claims, 9 Drawing Sheets

MINIATURIZED ELECTRICAL CONNECTOR FOR CONNECTING A CPU

CROSS-REFERENCE TO RELATED APPLICATION

This non-provisional application claims priority to and benefit of, under 35 U.S.C. § 119(a), Patent Application No. 201621180593.5 filed in P.R. China on Oct. 28, 2016, the entire content of which is hereby incorporated by reference.

FIELD OF THE INVENTION

The present invention relates to an electrical connector, and more particularly to an electrical connector that electrically connects a chip module to a circuit board.

BACKGROUND OF THE INVENTION

In order to enable an existing central processing unit (CPU) to have stronger functions and a faster arithmetic speed, pads of the central processing unit are increased more and more. However, in order to connect the central processing unit to a circuit board, an electrical connector includes an insulating body, the insulating body is provided with multiple terminal slots corresponding to the pads of the central processing unit, and multiple terminals are correspondingly contained in the multiple terminal slots. Therefore, the more the quantity of the pads of the central processing unit is, the more the quantity of the corresponding terminals of the electrical connector is, so that distances among the signal terminals are closer and closer. In order to avoid mutual crosstalk of the adjacent signal terminals in a signal transmission process and improve signal transmission quality, people usually mount a plurality of shielding terminals among the multiple signal terminals to elastically contact the CPU and to be soldered to a circuit board through a tin ball, to shield crosstalk among the signal terminals, and to meet the grounding need of the CPU. However, each shielding sheet elastically presses the CPU, so a resistance to be overcome when the CPU is mounted is certainly increased, and the risk of damaging the pads on the CPU is increased.

Therefore, a heretofore unaddressed need exists in the art to address the aforementioned deficiencies and inadequacies.

SUMMARY OF THE INVENTION

In one aspect, the present invention relates to a miniaturized electrical connector for connecting a CPU, and the electrical connector is stable in signal transmission.

In certain embodiments, an electrical connector is used for electrically connecting a chip module. The electrical connector includes an insulating body, a signal terminal, a first shielding sheet, and a second shielding sheet. The insulating body is used for sustaining a chip module. The signal terminal is retained in the insulating body, and elastically mates the chip module. The first shielding sheet is retained in the insulating body and located on one side of the signal terminal, and the first shielding sheet elastically mates the chip module. The second shielding sheet is retained in the insulating body and located on the other side of the signal terminal, and adjacent to the first shielding sheet. The first shielding sheet and the second shielding sheet are electrically conducted through an electrical conductor, and the second shielding sheet does not mate the chip module.

Compared with the art, certain embodiments of the present invention have the following beneficial advantages. In one conducting unit of the electrical connector, the first shielding sheet elastically urges the chip module, and the second shielding sheet is connected with the first shielding sheet through one electrical conductor, and does not urge the chip module. By this type of design, the needs of shielding crosstalk for the signal terminals and grounding the chip module are met, while pressing of the chip module by each shielding sheet is prevented, a resistance when the chip module is mounted is reduced, and the risk that the chip module is damaged when being mounted is lowered.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1A:
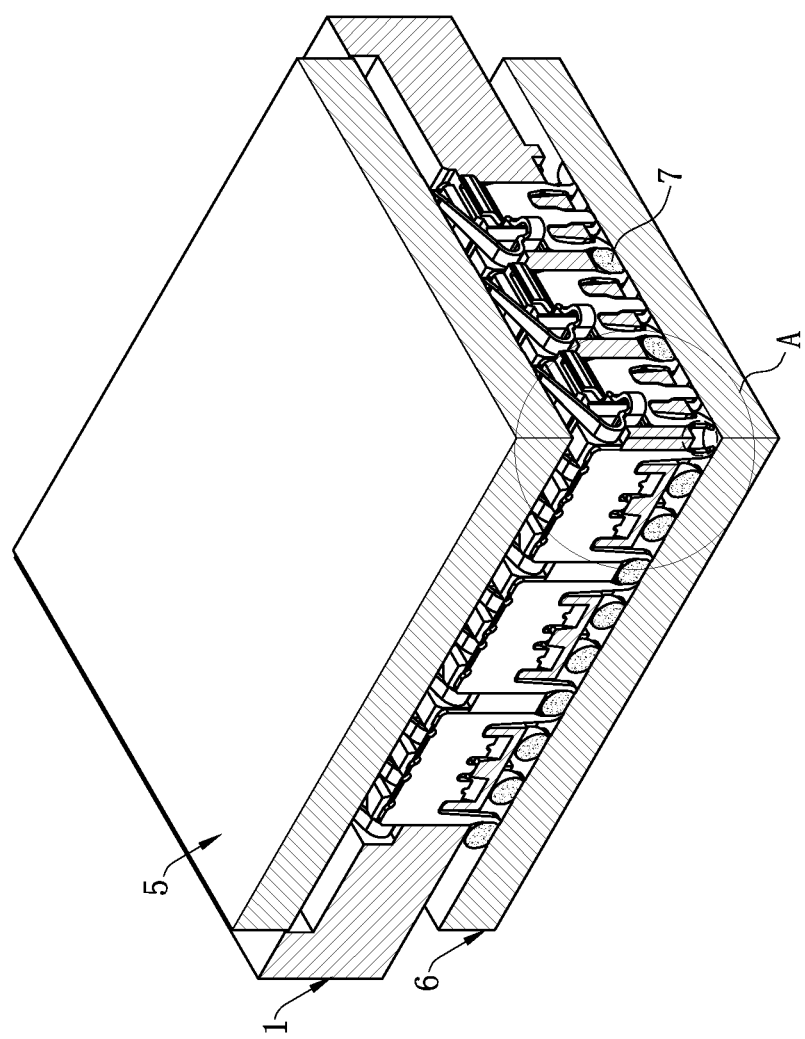
FIG. 1A is a schematic three-dimensional sectional view when an electrical connector according to one embodiment of the present invention connects a chip module to a circuit board.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1A-8. In accordance with the purposes of this invention, as embodied and broadly described herein, this invention, in one aspect, relates to an electrical connector.

Figure 1B:
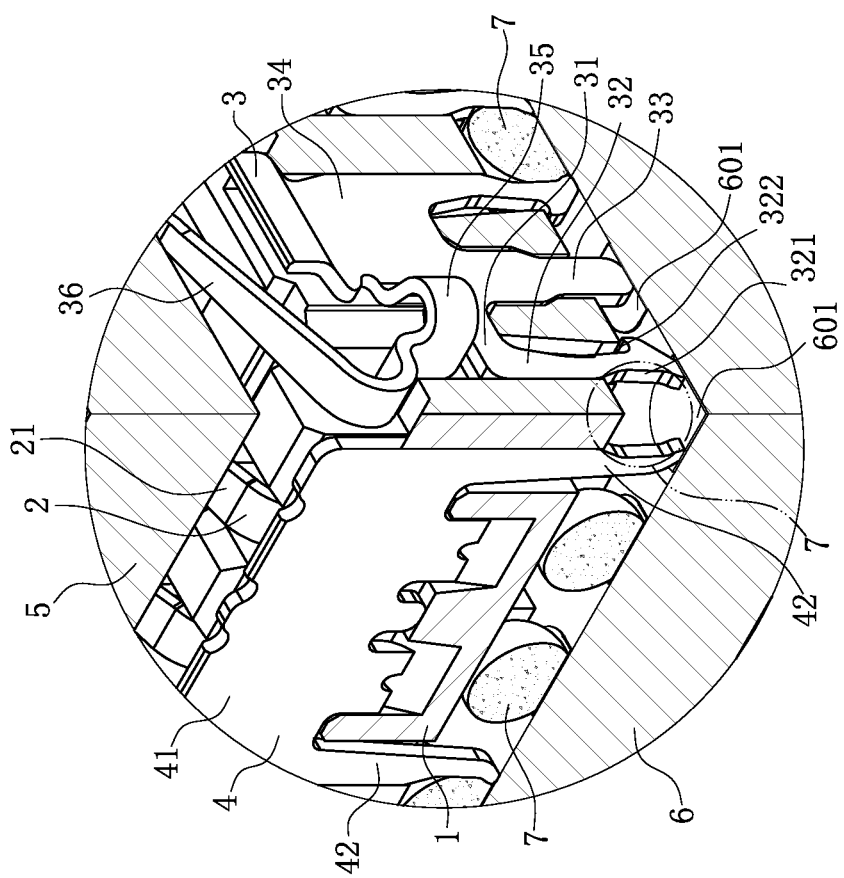
FIG. 1B is an enlarged view of a part highlighted by a circle A in FIG. 1A.
Figure 8:
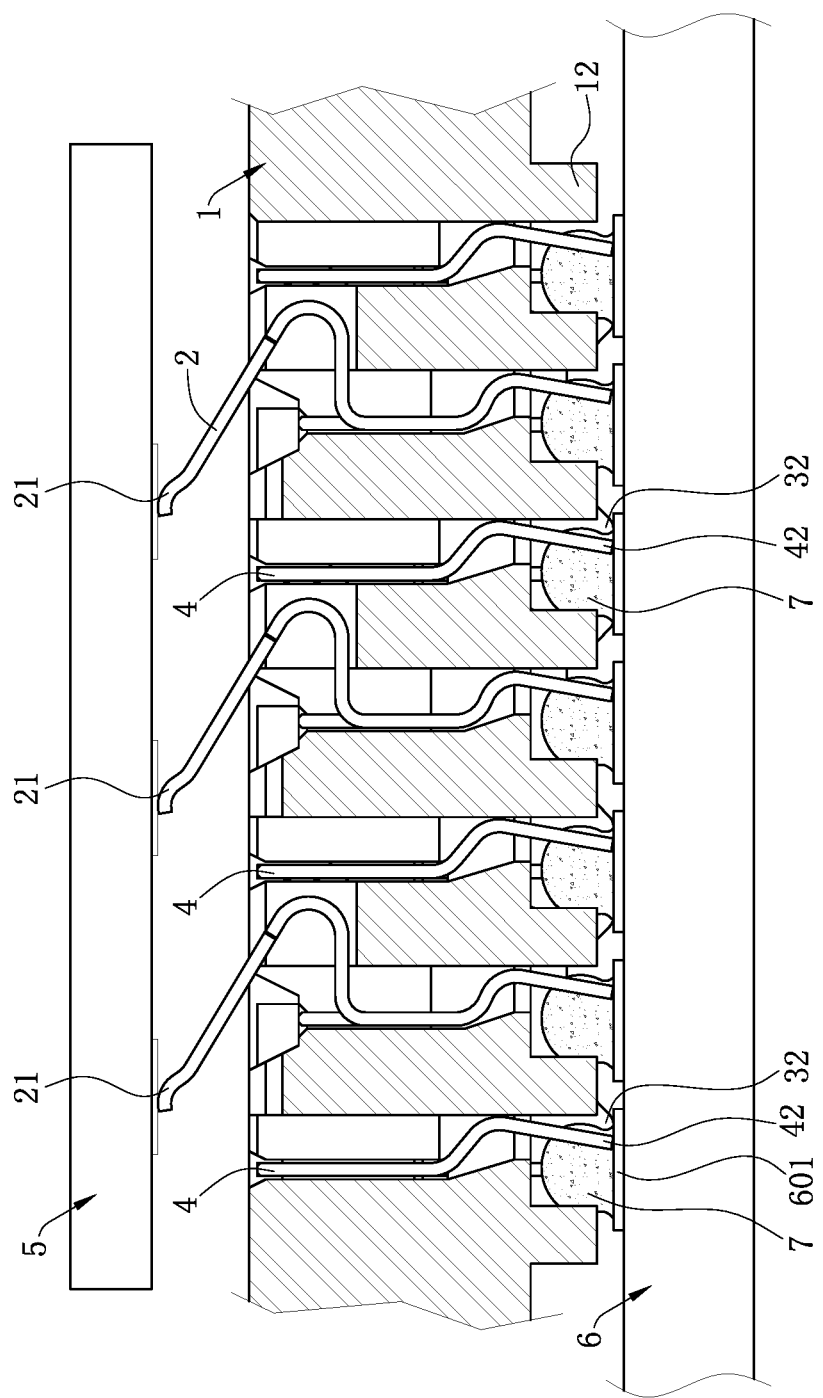
FIG. 8 is a sectional view of an electrical connector according to one embodiment of the present invention when a signal terminal urges against the chip module.

As shown in FIG. 1A, FIG. 1B and FIG. 8, an electrical connector according to one embodiment of the present invention is an LGA electrical connector 100, and is used for electrically connecting a chip module 5 to a circuit board 6. The electrical connector 100 includes an insulating body 1, multiple signal terminals 2, multiple first shielding sheets 3, and multiple second shielding sheets 4. The insulating body 1 is provided with multiple receiving slots 11 for receiving the multiple signal terminals 2. The multiple signal terminals 2 communicate the chip module 5 to the circuit board 6. The first shielding sheets 3 and the second shielding sheets 4 are disposed on the periphery of the signal terminals 2, are contained in the receiving slots 11, and are soldered to the circuit board 6.

Figure 5:
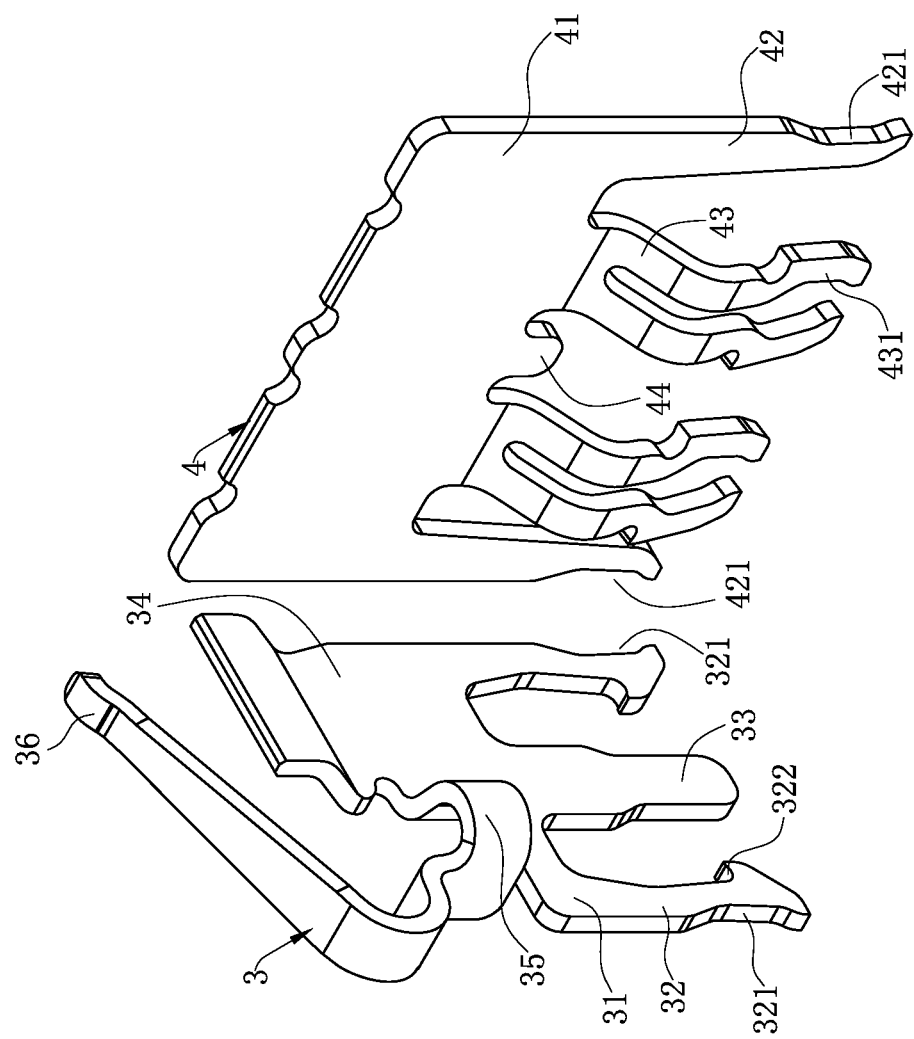
FIG. 5 is a schematic three-dimensional view of a first shielding sheet and a second shielding sheet in the electrical connector according to one embodiment of the present invention.

As shown in FIG. 1A, FIG. 1B and FIG. 5, the first shielding sheet 3 has a base 31. Two ends of the base 31 extend downward to respectively form a conducting portion 32. The middle of the base 31 extends downward to form a retaining portion 33. The two conducting portions 32 and the retaining portion 33 pass through the insulating body 1, and the retaining portion 33 is located between the two conducting portions 32. In the present embodiment, each of the conducting portions 32 is soldered to a gasket 601 on the circuit board 6 through an electrical connector 7, and the retaining portion 33 is directly soldered to another gasket 601. In other embodiments, a connection mode between the first shielding sheet 3 and the circuit board 6 is not limited, as long as stable communication between the first shielding sheet 3 and the circuit board 6 is ensured and the first shielding sheet 3 is grounded. One side of each of the conducting portions 32 is recessed to form a first groove 321, the tail end of the conducting portions 32 extends to a direction far from the groove 321 to form a clamp hook 322. The clamp hook 322 clamps upward against the insulating body 1, and prevents the first shielding sheet 3 from moving upward and separating from the insulating body 1.

Figure 6:
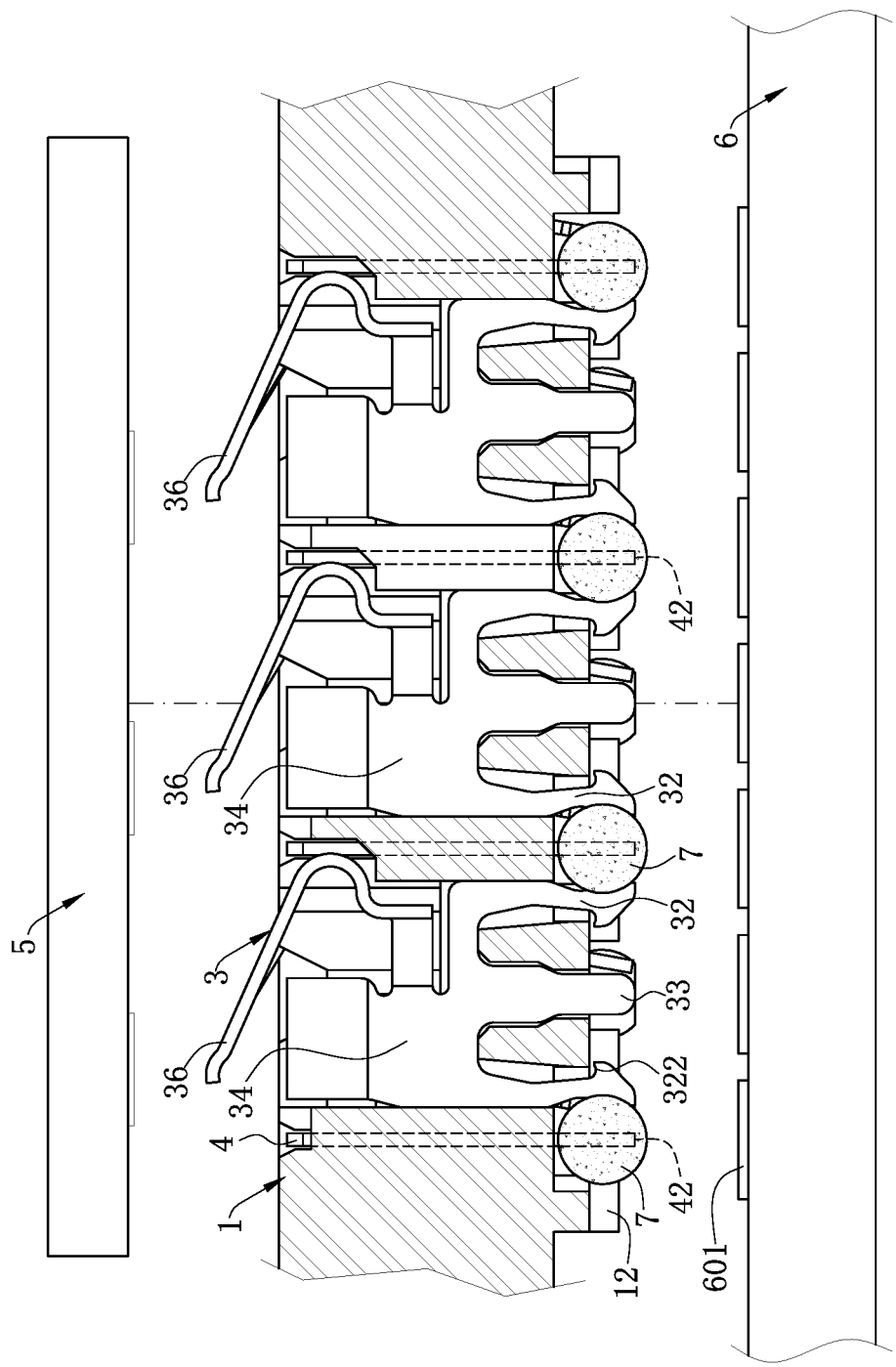
FIG. 6 is a sectional view of an electrical connector according to one embodiment of the present invention before mounting a chip module and acircuit a circuit board.
Figure 7:
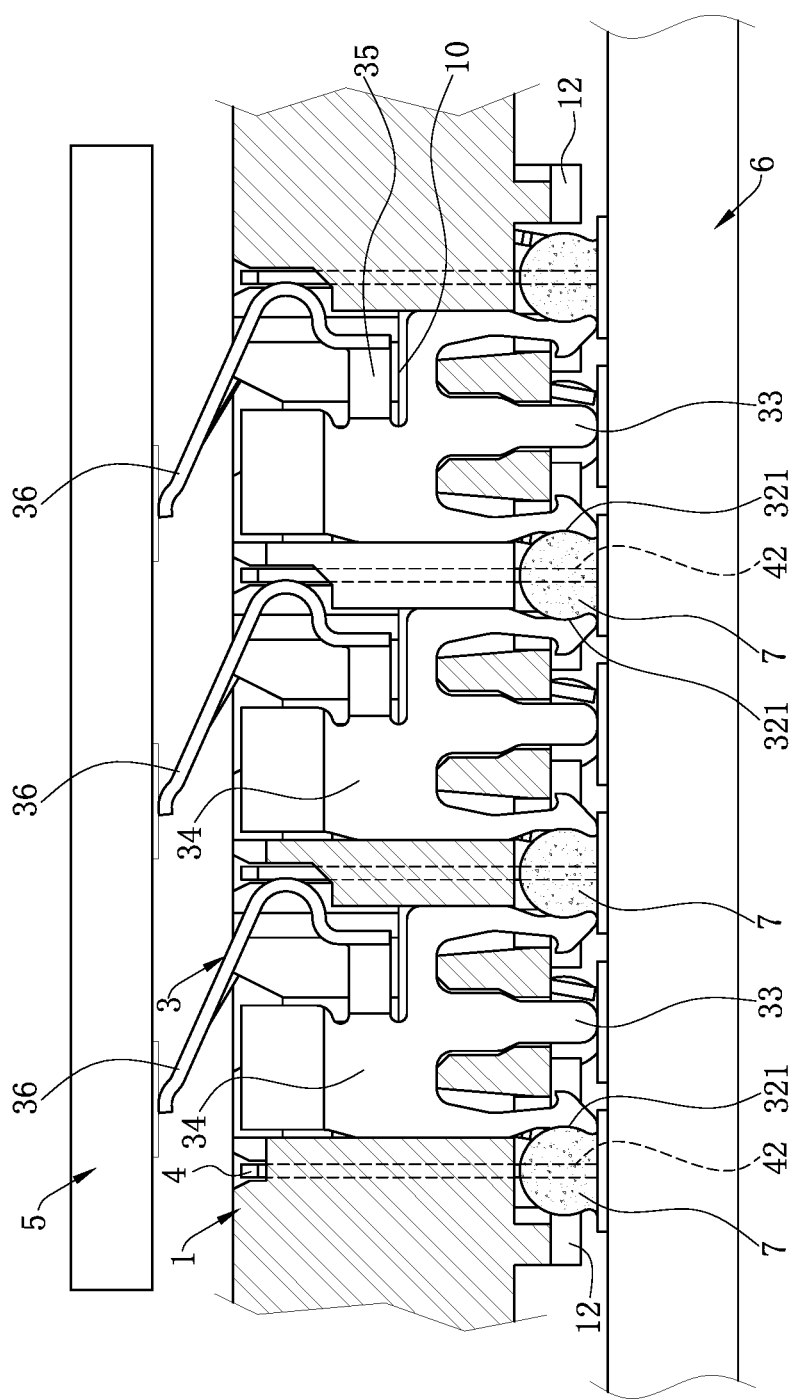
FIG. 7 is a sectional view of an electrical connector according to one embodiment of the present invention when the first shielding sheet urges against the chip module.

As shown in FIGS. 5-7, the base 31 extends upward to form a connecting portion 34. The width of the connecting portion 34 is smaller than the width of the base 31. One side of the connecting portion 34 is flush with one side edge of the base 31, and the other side of the connecting portion 34 bends and extends along a horizontal direction to form a protrusion portion 35. The protrusion portion 35 urges downward against a stopping surface 10 of the insulating body 1, and prevents the first shielding sheet 3 from moving downward under a pressure of the chip module 5. In the present embodiment, the protrusion portion 35 is formed by bending and extending from the connecting portion 34 toward the signal terminal 2 and then bending and extending away from the signal terminal 2. In other embodiments, the protrusion portion 35 only needs to be enabled to stably urge downward the insulating body 1, and the shape of the protrusion portion 35 is not limited herein. One end of the protrusion portion 35 bends and extends upward to form an urging portion 36 elastically urging against the chip module 5, so that a grounding contact of the chip module 5 is grounded through the first shielding sheet 3. The signal terminal 2 has a contact portion 21 elastically pressing the chip module 5 and a soldering arm 22 soldered to the circuit board 6. The urging portion 36 and the contact portion 21 are the same in shape, and stress uniformity of the chip module 5 is ensured.

The second shielding sheet 4 has a main portion 41 retained in the insulating body 1. The main portion 41 is flat-shaped, and a gap exists between the upper edge of the main portion 41 and the chip module 5, so that the second shielding sheet does not urge the chip module 5, too much pressure toward the chip module 5 when the chip module 5 is mounted is avoided, and the risk that the chip module 5 is damaged is lowered. Two ends of the main portion 41 extend downward to respectively form a conducting part 42, which are soldered respectively to different gaskets 601. The main portion 41 also extends downward to form two soldering arms 43. The bottom surface of the insulating body 1 is provided with protruding blocks 12 corresponding to the positions of the soldering arms 43. Each soldering arm 43 and the corresponding protruding block 12 jointly clamp the corresponding one electrical conductor 7, and are soldered to the circuit board 6. The two soldering arms 43 are located between the two conducting parts 42. In the present embodiment, the tail end of each of the soldering arms 43 forks into two branches 431, and the two branches 431 and the corresponding one protruding block 12 clamp the corresponding one electrical conductor 7, so as to solder the soldering arm 43 to the circuit board 6. The main portion 41 also extends downward to form a retaining portion 44. The retaining part 44 is located between the two soldering arms 43, and the length of the retaining part 44 is smaller than the lengths of the conducting parts 42, so that the retaining part 44 can be buried in the insulating body 1, and the second shielding sheet 4 is prevented from loosening in the insulating body 1. One side of each of the conducting parts 42 is recessed to form a second groove 421 jointly accommodating the electrical conductor 7 with the corresponding first groove 321. In the present embodiment, the electrical conductor 7 is a tin ball. In other embodiments, the electrical conductor 7 can be any other metal without limit herein as long as the electrical conductor 7 enables the conducting portions 32 and the conducting parts 42 to be stably connected.

Figure 4:
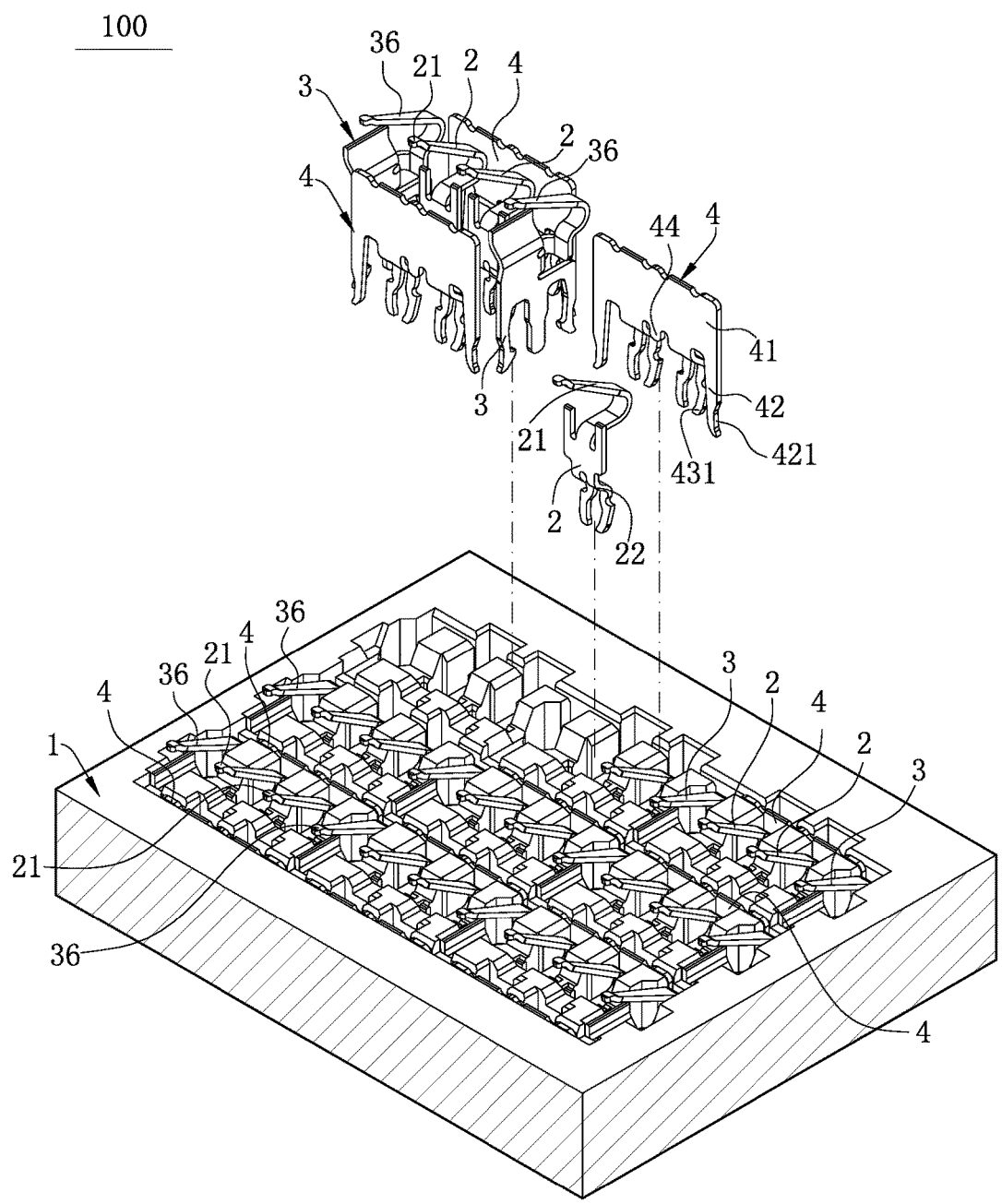
FIG. 4 is a part of a three-dimensional exploded view of an electrical connector according to one embodiment of the present invention viewed from another angle.

As shown in FIG. 4, the two first shielding sheets 3 are disposed on two opposite sides of the two signal terminals 2 in parallel, and the two second shielding sheets 4 are disposed on the other two sides of the two signal terminals 2 in parallel, so that the two first shielding sheets 3 and the two second shielding sheets 4 surround the two signal terminals 2 to enhance a shielding effect. Further, the adjacent first shielding sheet 3 and second shielding sheet 4 are perpendicular to each other. In the present embodiment, the two adjacent signal terminals 2 form a high-speed signal terminal pair, so as to meet the need of high-speed signal transmission. Conductive terminals in the electrical connector of the invention are arranged in matrix, where the two first shielding sheets 3 and the two second shielding sheets 4 surrounding a pair of the signal terminals 2 are taken as a minimum unit. In other embodiments, the specific number of terminals 2 can be freely assigned according to actual needs.

Figure 2:
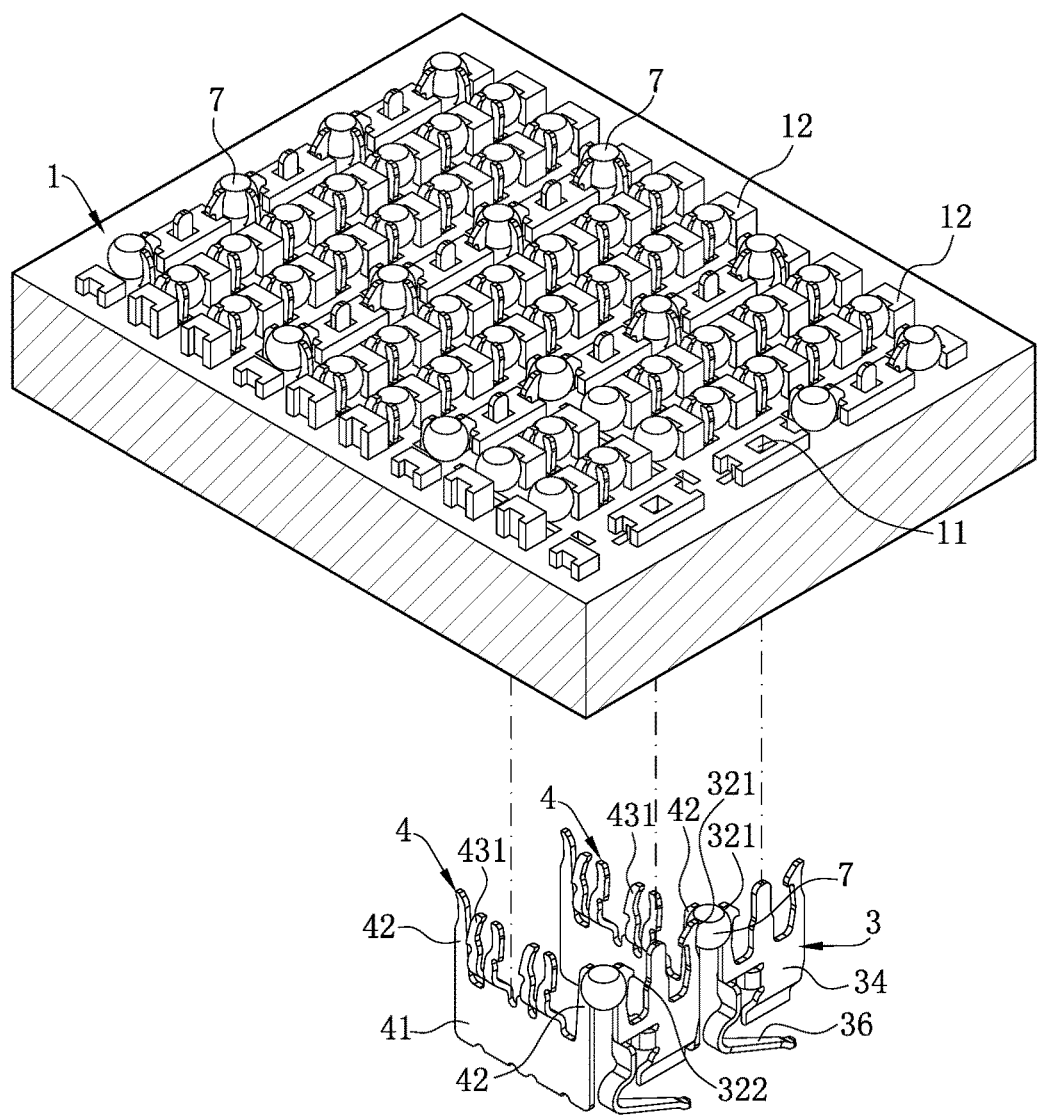
FIG. 2 is a schematic three-dimensional view of an electrical connector according to one embodiment of the present invention before assembling shielding sheets at the edge of the electrical connector.

As shown in FIG. 1A, FIG. 1B and FIG. 2, the adjacent conducting portion 32 and conducting part 42 located at four corners of a matrix jointly clamp the one electrical conductor 7, and are soldered to the same gasket 601 of the circuit board 6.

As shown in FIG. 2, the two first shielding sheets 3 and the one second shielding sheet 4, which are located on one edge of the matrix and are adjacent, are in T-shaped arrangement, so that the two conducting portions 32 and the one conducting part 42 jointly clamp the corresponding one electrical conductor 7 to be soldered to the same gasket 601 of the circuit board 6.

Figure 3:
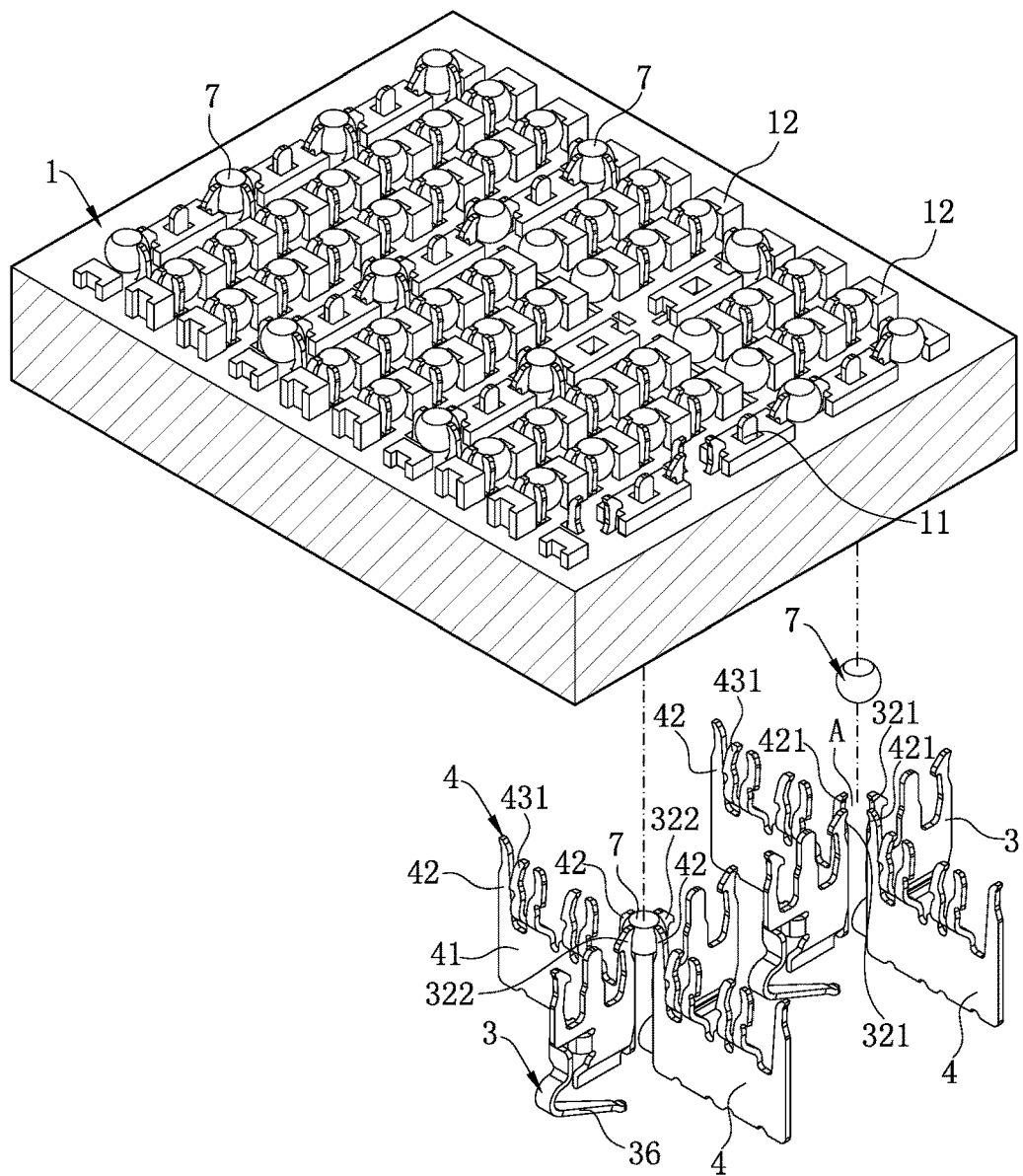
FIG. 3 is a schematic three-dimensional view of an electrical connector according to one embodiment of the present invention before assembling the shielding sheets at the middle part of the electrical connector.

As shown in FIG. 3, the two first shielding sheets 3 and the two second shielding sheets 4, which are located inside the matrix and are adjacent, are in crossing arrangement, so that the two conducting portions 32 and the two conducting part 42 form an accommodating area A for containing the corresponding one electrical conductor 7 to be soldered to the same gasket 601 of the circuit board 6.

In summary, the electrical connector according to certain embodiments of the present invention has the following beneficial advantages:

(1) The first shielding sheet 3 elastically urges against the chip module 5, the second shielding sheet 4 is connected with the first shielding sheet 3 through the electrical conductor 7, and does not urge against the chip module 5, such that not only the needs of shielding crosstalk between the signal terminals 2 and grounding the chip module 5 are met, but also each shielding sheet is prevented from contacting the chip module 5, a resistance when the chip module 5 is mounted is reduced, and the risk that the chip module 5 is damaged when being mounted is lowered.

(2) At least one of the conducting portion 32 and the conducting part 42 are soldered to the same gasket 601 through the same corresponding electrical conductor 7, such that each shielding sheet corresponds to one gasket 601 is avoided. Thus, not only the need of shielding crosstalk is met, but also the number of gaskets 601 needed by the circuit board 6 is reduced, so that all gaskets 601 on the circuit board 6 are sufficiently spaced, the risk that adjacent signal terminals are short-circuited during soldering is lowered, and the product production cost is reduced.

(3) The first groove 321 and the corresponding second groove 421 jointly clamp the one corresponding electrical conductor 7, thus clamping stability is increased and soldering accuracy is ensured.

(4) The urging portion 36 and the contact portion 21 are the same in shape, and stress uniformity of the chip module 5 is ensured.

(5) The retaining portions 33 are directly soldered to the circuit board 6, multi-point grounding of the first shielding sheet 3 and the circuit board 6 is ensured, and the shielding effect is enhanced.

(6) The soldering arms 43 and the protruding block 12 jointly clamp one corresponding electrical conductor 7 and are soldered to the circuit board 6, and multi-point grounding of the second shielding sheets 4 is ensured.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, comprising:
    an insulating body for sustaining a chip module;
    at least one signal terminal received in the insulating body, and elastically urging against the chip module;
    at least one first shielding sheet retained in the insulating body and located on one side of the at least one signal terminal, the at least one first shielding sheet elastically urging against the chip module; and
    at least one second shielding sheet retained in the insulating body and located on another side of the signal terminal, wherein the at least one second shielding sheet is adjacent to the at least one first shielding sheet, the at least one first shielding sheet and the at least one second shielding sheet are electrically connected through an electric conductor, and the at least one second shielding sheet does not urge against the chip module,
    wherein the at least one first shielding sheet has a conducting portion, the at least one second shielding sheet has a conducting part, the conducting portion and the conducting part extend out of a bottom surface of the insulating body, and are soldered to a circuit board through the electrical conductor.

2. The electrical connector of claim 1, wherein one side of the conducting portion is recessed to form a first groove, one side of the conducting part is recessed to form a second groove, and the first groove and the second groove jointly clamp the electrical conductor.

3. The electrical connector of claim 1, wherein the other side, opposite to the first groove, of the conducting portion extends to form a clamp hook, and the clamp hook clamps upward the insulating body.

4. The electrical connector of claim 1, wherein the at least one first shielding sheet has a base, the base extends upward to form a connecting portion, a width of the connecting portion is smaller than a width of the base, one side of the connecting portion is flush with one side of the base, and the other side of the connecting portion bends and extends along a horizontal direction to form a protrusion portion, and the protrusion portion urges downward against the insulating body.

5. The electrical connector of claim 4, wherein the protrusion portion is formed by bending and extending from the connecting portion toward the at least one signal terminal and then bending and extending away from the at least one signal terminal.

6. The electrical connector of claim 4, wherein one end of the protrusion portion bends upward and extends to form an urging portion, the urging portion extends out of the insulating body and elastically contacts the chip module, the at least one signal terminal has a contact portion connecting with the chip module, and a shape of the contact portion is the same as that of the urging portion.

7. The electrical connector of claim 1, wherein the at least one first shielding sheet has a base, each of two ends of the base extends downward to form a conducting portion, a middle of the base extends downward to form a retaining portion, the two conducting portions are soldered to a circuit board, and the retaining portion is retained in the insulating body.

8. The electrical connector of claim 1, wherein the at least one second shielding sheet has a main portion retained in the insulating body, the main portion is in a shape of a flat plate, a height of an upper edge of the main portion is lower than a height of an upper surface of the insulating body, each of two ends of the main portion extends downward to form a conducting part, the main portion also extends downward to form two soldering arms located between the two conducting parts, the two conducting parts and the two soldering arms are soldered to a circuit board.

9. The electrical connector of claim 8, wherein each of the soldering arms forks into two branches, the insulating body is provided with a protruding block, and the two branches and the protruding block jointly clamp a tin ball.

10. The electrical connector of claim 8, wherein the main portion further extends downward to form a retaining part located between the two soldering arms, a length of the retaining part is smaller than lengths of the conducting parts, and the retaining part clamps the insulating body.

11. The electrical connector of claim 1, wherein the at least one signal terminal comprises two signal terminals, the at least one first shielding sheet comprises two first shielding sheets, the at least one second shielding sheet comprises two second shielding sheets, the two first shielding sheets are respectively located on two opposite sides of the two signal terminals, and the two second shielding sheets are respectively located on the other two sides of the two signal terminals, such that the two first shielding sheets and the two second shielding sheets surround the two signal terminals; and wherein the two signal terminals and the two first shielding sheets are in four-row arrangement, and the two signal terminals and the two second shielding sheets are in three-row arrangement.

12. The electrical connector of claim 1, wherein the electrical conductor is a tin ball, the at least one first shielding sheet comprises two first shielding sheets, the at least one second shielding sheet comprises two second shielding sheets, each of the first shielding sheets and each of the second shielding sheets respectively have a first conducting portion and a second conducting portion passing through the insulating body, the two first conducting portions and the two second conducting portions form an accommodating area containing the tin ball, a bottom surface of the insulating body protrudes downward and extends to form protruding blocks, each of the second shielding sheets extends downward to form a soldering arm, and the soldering arms pass through the insulating body, and each of the soldering arms clamp another tin ball together with corresponding one of the protruding blocks.

13. The electrical connector of claim 1, wherein the signal terminal has a tail portion soldered to a circuit board, the at least one second shielding sheet has a soldering arm soldered to the circuit board, and a shape of the soldering arm is the same as that of the tail portion.

14. An electrical connector for electrically connecting a chip module, comprising:
an insulating body for sustaining a chip module;
at least one signal terminal received in the insulating body, and elastically urging against the chip module;
at least one first shielding sheet retained in the insulating body and located on one side of the at least one signal terminal, the at least one first shielding sheet elastically urging against the chip module; and
at least one second shielding sheet retained in the insulating body and located on another side of the signal terminal, wherein the at least one second shielding sheet is adjacent to the at least one first shielding sheet, the at least one first shielding sheet and the at least one second shielding sheet are electrically connected through an electric conductor, and the at least one second shielding sheet does not urge against the chip module,
wherein the at least one first shielding sheet comprises two first shielding sheets, the two first shielding sheets and the at least one second shielding sheet are crossly disposed and arranged in a shape of T, and jointly clamp the electrical conductor to be soldered to a circuit board.

15. The electrical connector of claim 14, wherein the at least one first shielding sheet comprises two first shielding sheets and the at least one second shielding sheet comprises two second shielding sheets, the two first shielding sheets and the two second shielding sheets are crossly disposed and jointly clamp the electrical conductor to be soldered to a circuit board.

16. The electrical connector of claim 14, wherein the signal terminal has a tail portion soldered to a circuit board, the at least one second shielding sheet has a soldering arm soldered to the circuit board, and a shape of the soldering arm is the same as that of the tail portion.

17. An electrical connector for electrically connecting a chip module, comprising:
an insulating body for sustaining a chip module;
at least one signal terminal received in the insulating body, and elastically urging against the chip module;

at least one first shielding sheet retained in the insulating body and located on one side of the at least one signal terminal, the at least one first shielding sheet elastically urging against the chip module;

at least one second shielding sheet retained in the insulating body and located on another side of the signal terminal, wherein the at least one second shielding sheet is adjacent to the at least one first shielding sheet, the at least one first shielding sheet and the at least one second shielding sheet are electrically connected through an electric conductor, and the at least one second shielding sheet does not urge against the chip module; and a plurality of electrical conductors disposed in a plurality of rows, wherein viewing from a direction perpendicular to the second shielding sheet, a number of the electrical conductors in each odd row is greater than a number of the electrical conductors in each even row.

18. The electrical connector of claim 17, wherein the at least one signal terminal comprises two signal terminals, the at least one first shielding sheet comprises two first shielding sheets, the at least one second shielding sheet comprises two second shielding sheets, the two first shielding sheets are respectively located on two opposite sides of the two signal terminals, and the two second shielding sheets are respectively located on the other two sides of the two signal terminals, such that the two first shielding sheets and the two second shielding sheets surround the two signal terminals; and wherein the two signal terminals and the two first shielding sheets are in four-row arrangement, and the two signal terminals and the two second shielding sheets are in three-row arrangement.

19. The electrical connector of claim 17, wherein the electrical conductor is a tin ball, the at least one first shielding sheet comprises two first shielding sheets, the at least one second shielding sheet comprises two second shielding sheets, each of the first shielding sheets and each of the second shielding sheets respectively have a first conducting portion and a second conducting portion passing through the insulating body, the two first conducting portions and the two second conducting portions form an accommodating area containing the tin ball, a bottom surface of the insulating body protrudes downward and extends to form protruding blocks, each of the second shielding sheets extends downward to form a soldering arm, and the soldering arms pass through the insulating body, and each of the soldering arms clamp another tin ball together with corresponding one of the protruding blocks.

20. The electrical connector of claim 17, wherein the signal terminal has a tail portion soldered to a circuit board, the at least one second shielding sheet has a soldering arm soldered to the circuit board, and a shape of the soldering arm is the same as that of the tail portion.

* * * * *